United States Patent [19]

Fujikawa et al.

[11] Patent Number: 5,592,317
[45] Date of Patent: Jan. 7, 1997

[54] CHROMIUM BLANKS FOR FORMING BLACK MATRIX-SCREEN AND COLOR FILTER FOR LIQUID CRYSTAL DISPLAY

[75] Inventors: Junji Fujikawa; Yukio Iimura; Masahiro Takahashi; Takashi Nishimoto; Hiroyuki Matsui; Masanobu Fujita, all of Tokyo-to, Japan

[73] Assignee: Dai Nippon Printing Co., Ltd., Japan

[21] Appl. No.: 576,138

[22] Filed: Dec. 21, 1995

[30] Foreign Application Priority Data

Dec. 22, 1994 [JP] Japan ................. 6-335383

[51] Int. Cl.$^6$ ............. G02F 1/1335; G03F 1/00
[52] U.S. Cl. ............. 349/110; 430/5; 349/105
[58] Field of Search ............. 359/67, 68, 586, 359/588, 609, 614, 62; 430/5, 7, 22, 311, 321

[56] References Cited

U.S. PATENT DOCUMENTS

| | | | |
|---|---|---|---|
| 4,720,442 | 1/1988 | Shinkai et al. | 430/5 |
| 5,279,911 | 1/1994 | Kamon et al. | 430/311 |
| 5,415,953 | 5/1995 | Alpay et al. | 430/5 |
| 5,514,499 | 5/1996 | Iwamatsu et al. | 430/5 |

*Primary Examiner*—Anita Pellman Gross
*Assistant Examiner*—Tai V. Duong
*Attorney, Agent, or Firm*—Parkhurst, Wendel & Burr, L.L.P.

[57] ABSTRACT

A chromium blank for forming a black matrix-screen to be used as a color filter for a liquid crystal display is formed by forming at least a first antireflection film, a second antireflection film and a screening film sequentially in that order on one major surface of a transparent substrate. Each of the first and the second antireflection film is a semitransparent film formed of a chromium compound or a chromium mixture, containing chromium as a principal component, and the screening film is formed of chromium, a chromium compound containing chromium as a principal component. The transparent substrate, the first antireflection film, the second antireflection film and the screening film meet an inequality: $n_s < n_1 < n_2 < n_3$, where $n_s$ is the refractive index of the transparent substrate, $n_1$ is the real part of the complex index of refraction of the first antireflection film, $n_2$ is the real part of the complex index of refraction of the second antireflection film, and $n_3$ is the real part of the complex index of refraction of the screening film, in the substantially entire visible wavelength range.

12 Claims, 6 Drawing Sheets

CHROMIUM BLANKS FOR FORMING BLACK MATRIX-SCREEN AND COLOR FILTER FOR LIQUID CRYSTAL DISPLAY

BACKGROUND OF THE INVENTION

1. Field of the Invention

The present invention relates to a color filter for a liquid crystal display and a blank for forming a black matrix-screen to be used in fabricating the color filter.

2. Description of the Background Art

Generally, a color filter for a liquid crystal display, fabricated by forming an R layer (red layer), a G layer (green layer) and a B layer (blue layer) on a transparent substrate provided with a black matrix-screen is used to improve the visibility of the liquid crystal display. Generally, the black matrix-screen is fabricated by subjecting a blank provided with a screening layer of chromium or the like to plating and etching.

Recent demand for the further improvement of the display quality of liquid crystal displays requires, for the further improvement of the visibility (visual recognizability) of liquid crystal displays, a black matrix-screen for liquid crystal displays, having a front surface, i.e., a surface on the side of the transparent substrate (display surface), having a further reduced reflectivity in the wavelength range of visible radiations in addition to light screening capability.

Figure 6:
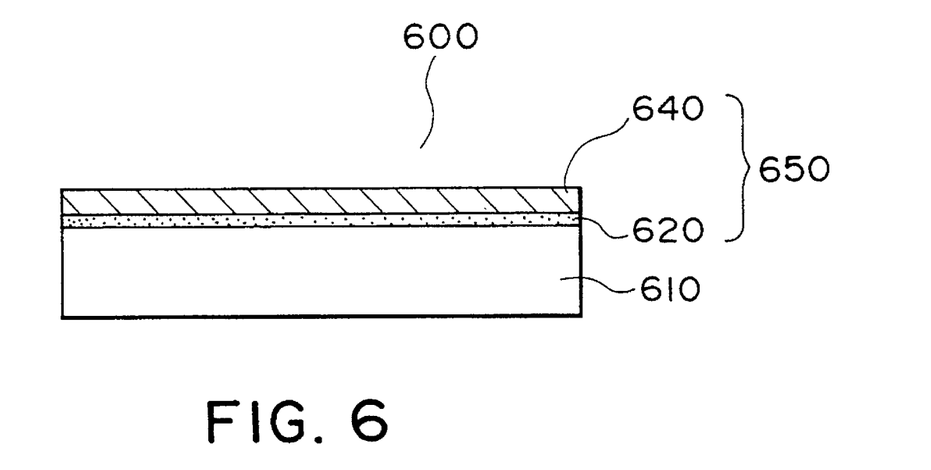
FIG. 6 is a sectional view of a prior art chromium blank for forming a black matrix-screen.
Figure 7:
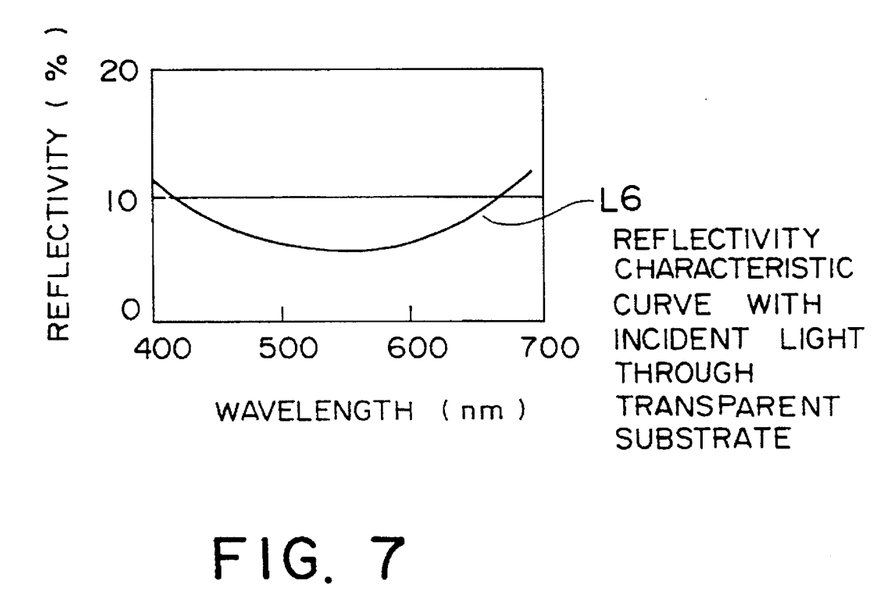
FIG. 7 is a graph showing the dependence of the reflectivity of the chromium blank of FIG. 6 on wavelength.

FIG. 6 shows a chromium blank proposed in JP-A No. 61-39024 to meet such a requirement. As shown in FIG. 6, a chromium blank for forming a black matrix-screen, having screening capability and a front surface having a low reflectivity has a transparent substrate 610, and a two-layer chromium film 650 consisting of an antireflection film 620 of chromium oxide or the like formed over the upper surface of a transparent substrate 610, and a screening film 640 of chromium or the like formed over the antireflection film 620. FIG. 7 shows the dependence of the reflectivity of the chromium blank with incident light through the transparent substrate 610 on the wavelength of the incident light.

However, as is evident from a reflectivity characteristic curve L6 shown in FIG. 7, it has been impossible to produce chromium blanks of such a construction having reflectivities with incident light through the transparent substrate 610 of a desired value or below, such as 10% or below, for all the wavelengths in the visible wavelength range of 400 to 700 nm.

Furthermore, since the reflectivity characteristic curve L6 has a minimum at a specific wavelength in the wavelength range of 450 to 650 nm, the reflectivities for wavelengths are liable to change depending on the thickness of the antireflection film 620, causing changes in the saturation and lightness of the color of the reflected light.

Generally, the reflectivity characteristic curve has a minimum at a specific wavelength in the range of 450 to 650 nm due to the thin-film interference effect. Therefore, the specific wavelength changes according to the small variation (irregularity) of the thickness of the thin film. Consequently, the chromium blank has different reflectivities for different wavelengths, respectively, causing the variation of the color tone of the color of the reflected light.

SUMMARY OF THE INVENTION

The present invention has been made to solve such problems and it is therefore an object of the present invention to provide a color filter for a liquid crystal display, provided with a black matrix-screen having reflectivities of a desired value or below to visible radiations of all the wavelengths in the visible wavelength range of 400 to 700 nm incident on its surface on the side of the transparent substrate and not significantly dependent on the thickness of the antireflection film. Another object of the present invention is to provide a chromium blank for the aforesaid black matrix-screen.

A blank for forming a black matrix-screen, in accordance with one aspect of the present invention comprises: a transparent substrate; a first antireflection film formed over one major surface of the transparent substrate; a second antireflection film formed over the first antireflection film; and a screening film formed over the second antireflection film; the first and second antireflection films and the screening film meeting an inequality: $n_s < n_1 < n_2 < n_3$, where $n_s$ is the refractive index of the transparent substrate, $n_1$ is the real part of the complex index of refraction of the first antireflection film, $n_2$ is the real part of the complex index of refraction of the second antireflection film, and $n_3$ is the real part of the complex index of refraction of the screening film, for visible radiations of all the wavelengths in the visible wavelength range.

A color filter for a liquid crystal display, in accordance with another aspect of the present invention comprises: a transparent substrate; a black matrix-screen formed on the transparent substrate; a colored layer of a pattern filling up spaces between the components of the black matrix-screen formed on the transparent substrate; and a transparent electrode film; wherein the black matrix-screen comprises: a transparent substrate; a first antireflection film formed over one major surface of the transparent substrate; a second antireflection film formed over the first antireflection film; and a screening film formed over the second antireflection film; and meets an inequality: $n_s < n_1 < n_2$, $n_3$, where $n_s$ is the refractive index of the transparent substrate, $n_1$ is the real part of the complex index of refraction of the first antireflection film, $n_2$ is the real part of the complex index of refraction of the second antireflection film, and $n_3$ is the real part of the complex index of refraction of the screening film, for visible radiations of all the wavelengths in the visible wavelength range.

DESCRIPTION OF THE PREFERRED EMBODIMENTS

Figure 1:
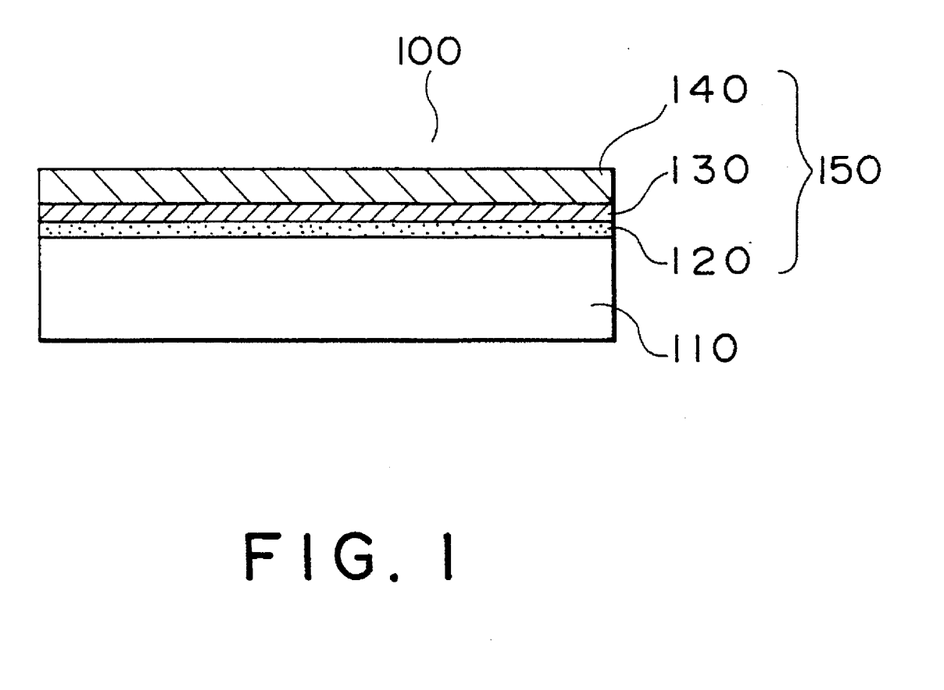
FIG. 1 is a sectional view of a chromium blank for forming a black matrix-screen, in a first embodiment according to the present invention.

Preferred embodiments of the present invention will be described hereinafter with reference to the accompanying drawings. Referring to FIG. 1, a chromium blank 100 for forming a black matrix-screen, in accordance with the present invention comprises a transparent substrate 110, and a first antireflection film 120, a second antireflection film 130 and a screening film 140 formed sequentially in that order on one major surface of the transparent substrate 110. The chromium blank 100 is incorporated into a color filter for a liquid crystal display. Each of the first antireflection film 120 and the second antireflection film 130 is a semitransparent film of a chromium compound or mixture, containing chromium as a principal component, and the screening film 140 is a light-screening film of a chromium compound or mixture, containing chromium as a principal component.

The first antireflection film 120, the second antireflection film 130 and the screening film 140 constitute a chromium film 150. The chromium blank 100 meets an inequality: $n_s < n_1 < n_2 < n_3$, where $n_s$ is the refractive index of the transparent substrate 110, $n_1$ is the real part of the complex index of refraction of the first antireflection film 120, $n_2$ is the real part of the complex index of refraction of the second antireflection film 130, and $n_3$ is the real part of the complex index of refraction of the screening film 140, for visible radiations of substantially all the wavelengths in the visible wavelength range.

Preferably, the chromium blank 100 meets the inequality: $n_s < n_1 < n_2 < n_3$ at least in the wavelength range of 450 to 650 nm in the visible wavelength range.

In the chromium film 150, the first antireflection film 120 contains 30 to 50% atomic percentage (at.) of chromium, and one of oxygen, a combination of oxygen and nitrogen, a combination of oxygen and carbon and a combination of oxygen, nitrogen and carbon, the second antireflection film 130 contains 45 to 65% atomic percentage (at.) chromium, and one of oxygen, a combination of oxygen and nitrogen, a combination of oxygen and carbon and a combination of oxygen, nitrogen and carbon, and the screening film 140 is a chromium film.

In the chromium film 150, the first antireflection film 120 may contain 30 to 50% atomic percentage (at.) of chromium, and one of oxygen, a combination of oxygen and nitrogen, a combination of oxygen and carbon and a combination of oxygen, nitrogen and carbon, the second antireflection film 130 may contain 45 to 65% atomic percentage (at.) chromium, and one of oxygen, a combination of oxygen and nitrogen, a combination of oxygen and carbon and a combination of oxygen, nitrogen and carbon, and the screening film 140 may contain 60% atomic percentage (at.) or above chromium, and one of oxygen, a combination of oxygen and nitrogen, a combination of oxygen and carbon and a combination of oxygen nitrogen and carbon.

The first antireflection film 120, the second antireflection film 130 and the screening film 140 of the blank 100 may be formed by a sputtering process, a vacuum evaporation process or a CVD process.

The thicknesses of the first antireflection film 120 and the second antireflection film 130 are in a range of thickness capable of adjusting the bottom of the reflection spectrum in the visible wavelength range; preferably, in the range of 200 to 500 Å. The thickness of the screening film 140 capable of exerting a predetermined screening effect is 500 Å or above. Although it is preferable that the blank 100 meets the inequality: $n_s < n_1 < n_2 < n_3$ for wavelengths in the entire visible wavelength range, the blank 100 is sufficiently effective when the blank 100 meets the inequality at least in the wavelength range of 450 to 650 nm.

In the combination of chromium, and one of oxygen, a combination of oxygen and nitrogen, a combination of oxygen and carbon and a combination of oxygen, nitrogen and carbon, the greater the atomic percentage of the chromium compound (the chromium mixture), the screening effect of the combination is higher, the transparency of the combination including chromium is comparatively high when the atomic percentage of chromium is in the range of 30 to 50% at., the screening effect of the combination is comparatively high when the chromium content is in the range of 45 to 65% at. and the screening effect of the combination is high when the chromium content is 60% at. or above. Therefore, the composition of the screening film 140 has a chromium content in the aforesaid range of atomic percentage.

The transparency of the combination including chromium increases with the increase of the atomic percentage of oxygen. Although increase in the atomic percentage of nitrogen makes the transparency of the combination including chromium increase, the transparency increasing effect of nitrogen is not as high as that of oxygen. Therefore, nitrogen is suitable for precisely adjusting the transparency of the combination including chromium.

Carbon enhances particularly effectively the ease of etching. The etching rate decreases with the increase of the atomic percentage of carbon.

Basically, it is desirable that the first antireflection film 120, the second antireflection film 130 and the screening film 140 are formed so that the chromium film 150 has a screening effect and a satisfactory reflectivity characteristic and that the chromium film 150 is easy to etch.

Figure 5A:
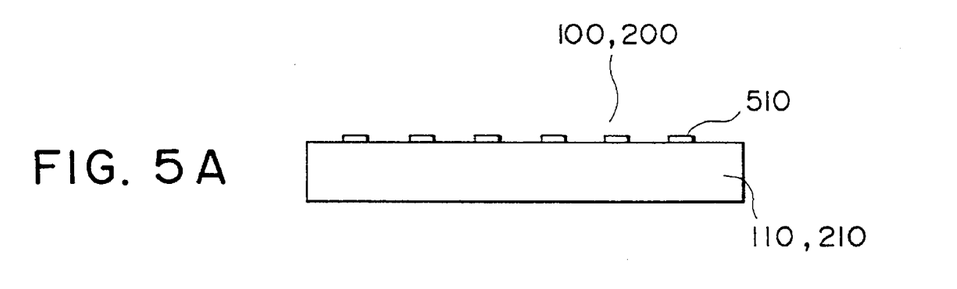
FIG. 5A is a sectional view of assistance in explaining a color filter for a liquid crystal display, in accordance with the present invention.
Figure 5B:
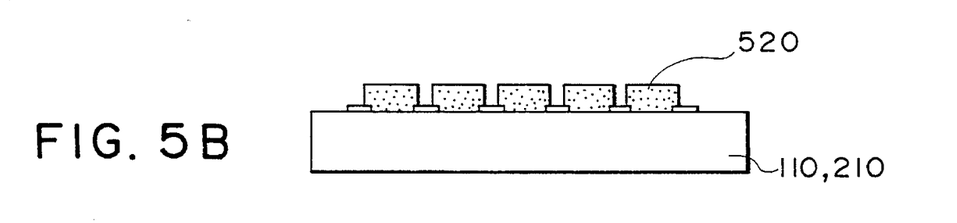
FIG. 5B is a sectional view of assistance in explaining a color filter for a liquid crystal display, in accordance with the present invention.
Figure 5C:
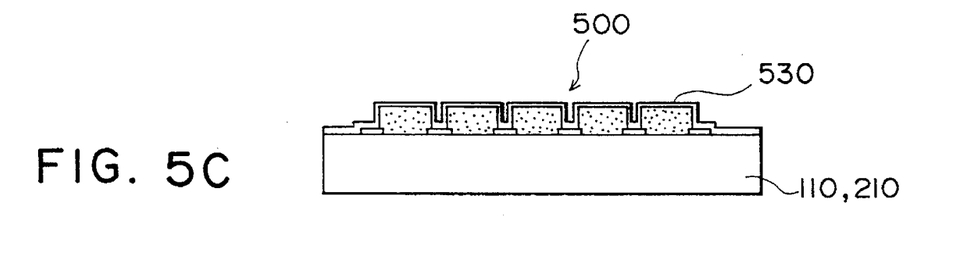
FIG. 5C is a sectional view of assistance in explaining a color filter for a liquid crystal display, in accordance with the present invention.

Referring to FIGS. 5A, 5B and 5C, when fabricating a color filter 500 for a liquid crystal display, in accordance with the present invention, the chromium blank 100 provided with the chromium film 150 is patterned by etching to form a black matrix-screen 510 on the transparent substrate 110 as shown in FIG. 5A. Next, a color pattern 520 is formed on the transparent substrate 110 as shown in FIG. 5B, and then a transparent electrode film 530 is formed to complete the color filter 500 for a liquid crystal display.

Generally, the chromium film 150 formed on the transparent substrate 110 is subjected to a photolithographic processes for patterning and etching to form the black matrix-screen 510. The color pattern 520 is formed by a pigment dispersion process, a dyeing process or a printing process. The color pattern 520 comprises patterns of predetermined shapes of primary colors R (red), G (green) and B (blue), i.e., a predetermined R pattern, a predetermined G pattern and a predetermined B pattern. When necessary, a transparent protective film is formed over the color pattern 520 for protection, and then the transparent electrode film 530 for driving a liquid crystal is formed over the protective film by a sputtering process or the like.

The chromium blank 100 for forming a black matrix-screen shown in FIG. 1 thus constructed has a desired reflectivity, such as 10% or below in the substantially entire visible wavelength range, with incident light through the exposed surface of the transparent substrate 110 and is capable of suppressing the variation of color tone due to the variation of the thickness of the antireflection film.

The color filter 500 for a liquid crystal display, in accordance with the present invention having the black matrix-screen 510 formed by processing the chromium blank 100 by the processes illustrated in FIGS. 5A to 5C further improves the visibility.

EXAMPLE 1

Concrete examples of the chromium blank for forming a black matrix-screen, in accordance with the present invention will be described below.

A chromium blank for forming a black matrix-screen, in accordance with the present invention in Example 1 will be described with reference to FIGS. 1, 2A, 2B and 2C.

Figure 2A:
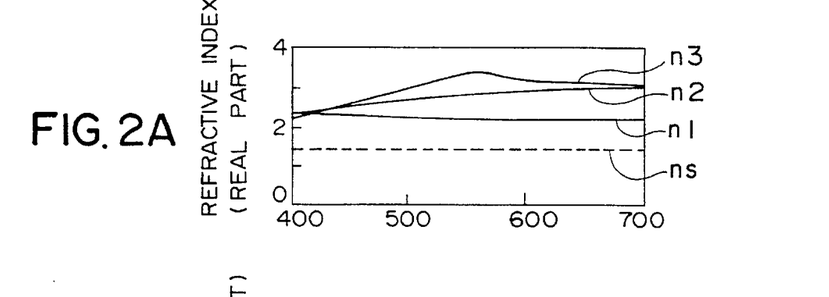
FIG. 2A is a graph showing the dependence of the refractive index of the chromium blank of FIG. 1 on wavelength.
Figure 2B:
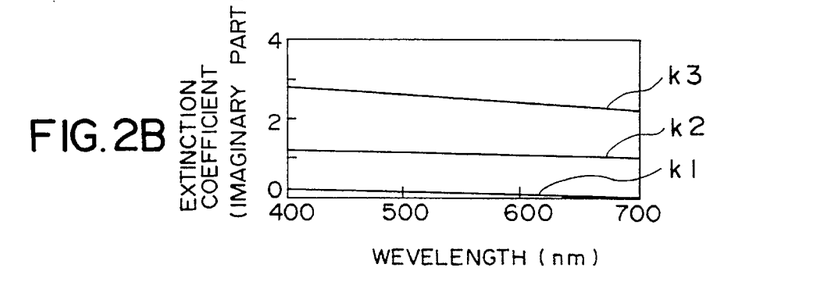
FIG. 2B is a graph showing the dependence of the extinction coefficient of the chromium blank of FIG. 1 on wavelength.
Figure 2C:
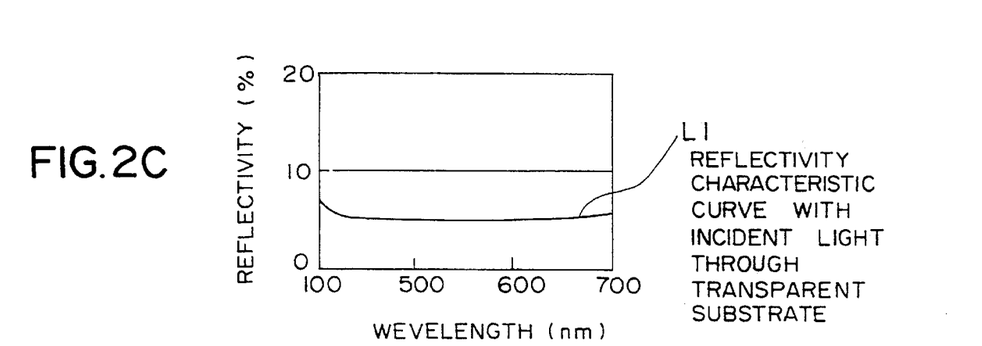
FIG. 2C is a graph showing the dependence of the reflectivity of the chromium blank of FIG. 1 on wavelength.

FIG. 1 is a sectional view of the chromium blank for forming a black matrix-screen, and FIGS. 2A, 2B and 2C are graphs showing the reflectivity characteristics of the chromium blank.

Shown in FIG. 1 are a chromium blank 100, a transparent substrate 110, a first antireflection film 120, a second antireflection film 130, a screening film 140, and a chromium film 150 consisting of the first antireflection film 120, the second antireflection film 130 and the screening film 140.

The first antireflection film 120, the second antireflection film 130 and the screening film 140 of the chromium blank 100 in Example 1 are formed sequentially in that order in a laminated film on the transparent substrate 110. The transparent substrate 110 is formed of 7059 glass (Corning Co.) having refractive index $n_s \approx 1.5$ in the wavelength range of 400 to 700 nm, the first antireflection film 120 is formed of a chromium compound of chromium and oxygen, the second antireflection film 130 is formed of a chromium compound of chromium and nitrogen, and the screening film 140 is formed of chromium.

The first antireflection film 120, the second antireflection film 130 and the screening film 140 were formed by known reactive DC sputtering processes using a chromium target.

The first antireflection film 120 was formed by a reactive DC sputtering process using an argon-nitrogen mixed gas. The first antireflection film 120 contains about 45% at. chromium and 55% at. oxygen. The first antireflection film 120 is a 430 Å thick semitransparent film having a complex index of refraction having a real part $n_1=2.2$ and an extinction coefficient, i.e., an imaginary part, $k_1=0.1$ with a wavelength of 550 nm.

The second antireflection film 130 was formed by a reactive DC sputtering process using an argon-nitrogen mixed gas. The second antireflection film 130 contains about 60% at. chromium and about 40% at. oxygen. The second antireflection film 130 is a 380 Å thick translucent film having a complex index of refraction having a real part $n_2=2.8$ and an extinction coefficient, i.e., an imaginary part, $k_2=1.1$ with a wavelength of 550 nm.

The screening film 140 was formed by a process using argon gas in a thickness of 800 Å. The screening film 140 has a complex index of refraction having a real part $n_3=3.3$ and an extinction coefficient $k_3=2.5$ with a wavelength of 550 nm.

The compositions of the films were analyzed by the generally used Auger electron spectroscopy. Each of those films was formed on a silicon wafer by the aforesaid process, and the spectral refractive index of the film was measured by the spectroellipsometer MOSS ES-4G (SOPRA Co., France)

The dependence of the spectral refractive index of each of the first antireflection film 120, the second antireflection film 130 and the screening film 140 on wavelength in the wavelength range of 400 to 700 nm is shown in FIGS. 2A, 2B and 2C.

As is obvious from FIG. 2A, the relation in refractive index between the refractive index $n_S$ ($\approx 1.5$) of the transparent substrate 110, the respective real parts $n_1$, $n_2$ and $n_3$ of the complex indices of refraction of the first antireflection film 120, the second antireflection film 130 and the screening film 140 meets the inequality: $n_s<n_1 n_2 <n_3$ in the wavelength range of 450 to 700 nm within the visible wavelength range of 400 to 700 nm. In this case, it has been experimentally evident that the overall quantity of light reflected toward the transparent substrate 110 from between the transparent substrate 110 and the first antireflection film 120, from between the first antireflection film 120 and the second antireflection film 130 and from between the second antireflection film 130 and the screening film 140 is reduced and, consequently, a comparatively small quantity of light is reflected toward the display screen.

As is obvious from FIG. 2B, the relation between the respective extinction coefficients $k_1$, $k_2$ and $k_3$ of the first antireflection film 120, the second antireflection film 130 and the screening film 140 meets an inequality: $k_1<k_2<k_3$, which proves that the absorbing effect of the films further enhances the effect of suppressing the reflection of light toward the display screen.

The chromium blank 100 in Example 1 having the aforesaid construction has a flat reflectivity characteristic, as compared with the conventional chromium blank, and low reflectivities of 8% or below in the entire visible wavelength range of 400 to 700 nm as shown in FIG. 2C.

The reflectivity including the effect of the reflectivity of the glass surface was measured by the reflection spectrophotometer type 330 (Hitach, Ltd.) using a 60 mm diameter integrating sphere, and magnesium oxide as reference.

EXAMPLE 2

A chromium blank in Example 2 will be described below.

Figure 3:
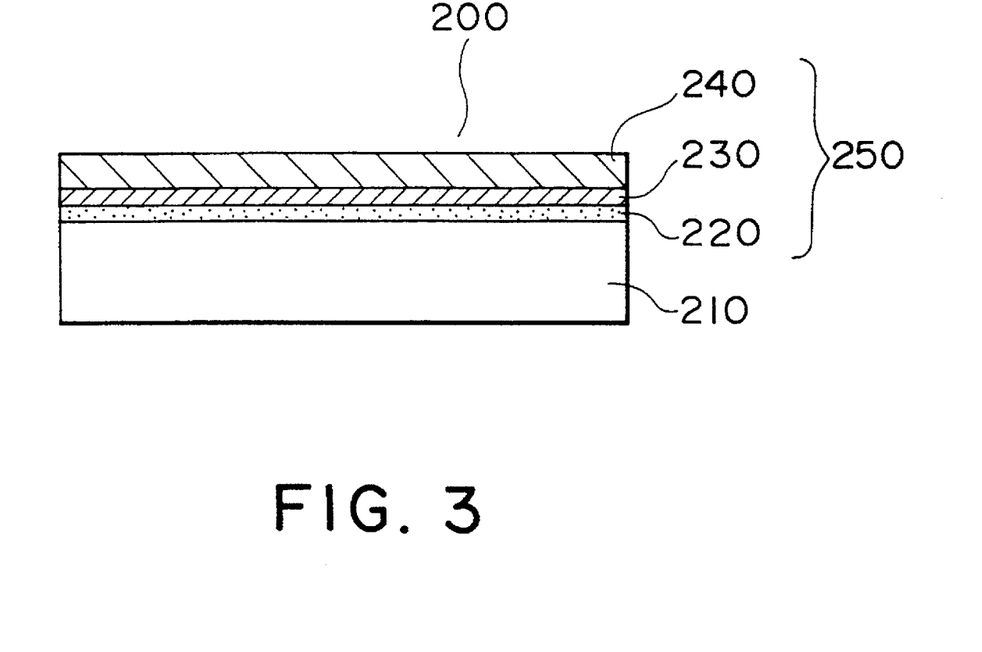
FIG. 3 is a sectional view of a chromium blank for forming a black matrix-screen, in a second embodiment according to the present invention.

A chromium blank 200 in Example 2, similarly to that in Example 1, has a chromium film 250 comprising a first antireflection film 220, a second antireflection film 230 and a screening film 240 formed sequentially in that order on a transparent substrate 210 (see FIG. 3). The transparent substrate 210 is formed of 7059 glass (Corning Co.) having refractive index $n_s \approx 1.5$ in the wavelength range of 400 to 700 nm, the first antireflection film 220 is formed of a chromium compound containing chromium and oxygen as principal components and nitrogen and carbon, the second antireflection film 230 is formed of a chromium compound containing oxygen and carbon, and chromium and nitrogen as principal components, and the screening film 240 is formed of chromium.

The first antireflection film 220, the second antireflection film 230 and the screening film 240 were formed by known reactive DC sputtering processes using a chromium target.

The first antireflection film 220 was formed by a reactive DC sputtering process using an argon-nitrogen mixed gas containing nitrogen gas and carbon dioxide gas as additives. The first antireflection film 220 contains about 45% at. chromium, 45% at. oxygen, about 8% at. nitrogen and about 2% at. carbon. The first antireflection film 220 is a 430 Å thick semitransparent film having a complex index of refraction having a real part $n_1=2.1$ and an extinction coefficient, i.e., an imaginary part, $k_1=0.1$ with a wavelength of 550 nm.

The second antireflection film 230 was formed by a reactive DC sputtering process using an argon-nitrogen mixed gas containing oxygen gas and carbon dioxide gas as additives. The second antireflection film 230 contains about 60% at. chromium, about 30% at. nitrogen, about 5% at. oxygen and about 5% at. carbon. The second antireflection film 230 is a 480 Å thick translucent film having a complex index of refraction having a real part $n_2=2.6$ and an extinction coefficient, i.e., an imaginary part, $k_2=0.9$ with a wavelength of 550 nm.

The screening film 240 of chromium was formed by a process using argon gas in a thickness of 800 Å. The screening film 240 has a complex index of refraction having a real part $n_3=3.3$ and an extinction coefficient $k_3=2.5$ with a wavelength of 550 nm.

Figure 4A:
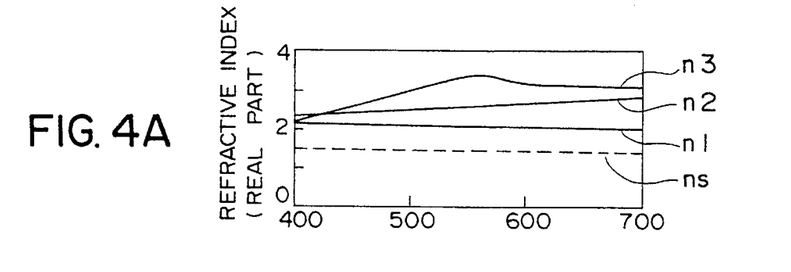
FIG. 4A is a graph showing the dependence of the refractive index of the chromium blank of FIG. 3 on wavelength.
Figure 4B:
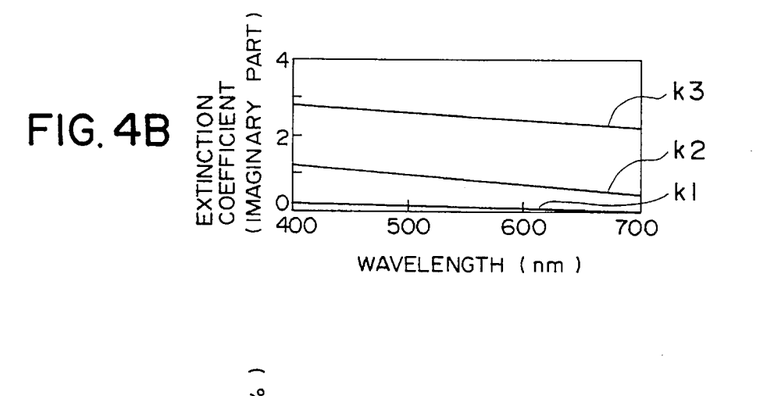
FIG. 4B is a graph showing the dependence of the extinction coefficient of the chromium blank of FIG. 3 on wavelength.
Figure 4C:
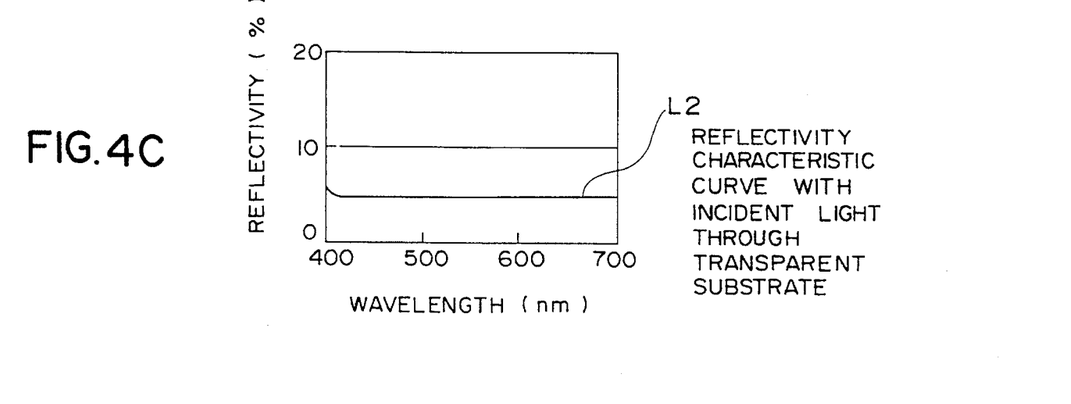
FIG. 4C is a graph showing the dependence of the reflectivity of the chromium blank of FIG. 3 on wavelength.

The dependence of the spectral refractive index and the extinction coefficient of each of the first antireflection film 220, the second antireflection film 230 and the screening film 240 on wavelength in the wavelength range of 400 to 700 nm is shown in FIGS. 4A, 4B and 4C.

As is obvious from FIG. 4A, the relation in refractive index among the refractive index $n_s$ ($\simeq 1.5$) of the transparent substrate 210, the respective real parts $n_1$, $n_2$ and $n_3$ of the complex indices of refraction of the first antireflection film 220, the second antireflection film 230 and the screening film 240 meets the inequality: $n_s<n_1n_2<n_3$ in the wavelength range of 440 to 700 nm in the visible wavelength range of 400 to 700 nm. Therefore, the overall quantity of light reflected toward the transparent substrate 210 from between the transparent substrate 210 and the first antireflection film 220, from between the first antireflection film 220 and the second antireflection film 230 and from between the second antireflection film 230 and the screening film 240 is reduced and, consequently, a comparatively small quantity of light is reflected toward the display screen.

As is obvious from FIG. 4B, the relation among the respective extinction coefficients $k_1$, $k_2$ and $k_3$ of the first antireflection film 220, the second antireflection film 230 and the screening film 240 meets an inequality: $k_1<k_2<k_3$, which proves that the absorbing effect of the films further enhances the effect of suppressing the reflection of light toward the display screen.

The chromium blank 200 in Example 2 having the aforesaid construction has low reflectivities of 6% or below in the entire visible wavelength range of 400 to 700 nm as indicated by a reflectivity characteristic curve L2 in FIG. 4C, which are even lower than those of Example 1.

The chromium film 250 of the blank 200 in Example 2 was patterned by a wet etching process using an etchant to form a black matrix-screen. This black matrix-screen was finer than that formed by processing the chromium blank 100 in Example 1 and the edges of the components of the pattern were formed in satisfactory shapes.

A generally known etchant prepared by mixing 165 g of $(NH_4)_2Ce(NO_3)_6$, 43 ml of 70% $HClO_4$ and 1000 ml of pure water was used for etching the chromium film 250 at about 23° C.

The same measuring methods as those employed for measuring the chromium blank 100 in Example 1 were used for the analysis of the composition, the measurement of spectral refractive index, the measurement of the thicknesses of the films and the measurement of reflectivity.

EXAMPLE 3

A concrete example of a color filter for a liquid crystal display, fabricated by processing the chromium blank 200 in Example 2.

The filter for a liquid crystal display, in accordance with the present invention is formed by processing the chromium blank in Example 2 to form a black matrix-screen on the substrate, and forming a color pattern comprising patterns of R (red), G (green) and B (blue), and forming a conductive, transparent electrode over the color pattern.

A method of fabricating the color filter for a liquid crystal display will be briefly described with reference to FIGS. 5A, 5B and 5C.

Referring to FIGS. 5A, 5B and 5C, there are shown a color filter 500, a black matrix-screen 510, a color pattern 520 and a transparent electrode 530.

The chromium film 250 of the chromium blank 200 in Example 2, formed on the transparent substrate 210 was patterned to form the black matrix screen 510 as shown in FIG. 5A.

When forming the black matrix-screen 510, a photoresist film was formed over the chromium film 250 of the chromium blank 200, the photoresist film was patterned in a photoresist pattern, and then the chromium film 250 was etched using an etchant prepared by mixing 165 g of $(NH_4)_2Ce(NO_3)_6$, 43 ml of 70% $HClO_4$ and 1000 ml of pure water at about 23° C., and the photoresist pattern to form the black matrix screen 510.

Then, the color pattern 520 was formed on the transparent substrate 210 so as to fill up spaces between the black matrix screen 510 as shown in FIG. 5B.

The color pattern 520 was formed on the transparent substrate 210 by applying a red photosensitive resin containing red pigment dispersed therein in a 1.2 μm thick red film, drying the red film for 30 min at 70° C. in an oven, exposing the red film using a mask of a predetermined pattern, spray-developing the exposed red film using water to form a red pattern, and baking the red pattern for 30 min at 150° C. for heat setting.

A green pattern and a blue pattern were formed in that order in predetermined areas, respectively, by the same process as the red pattern.

Then, an about 20 nm thick transparent electrode film 530 was formed on the transparent substrate 210 provided with the color pattern 520 consisting of the red, the green and the blue pattern as shown in FIG. 5c by a DC sputtering apparatus using an ITO target.

As is apparent from the foregoing description, the chromium blanks 100 and 200 for forming a black matrix-screen, in accordance with the present invention limit the respective reflectivities of the transparent substrates 110 and 210 to a predetermined value, such as 10% or below in the entire visible wavelength range of 400 to 700 nm, and suppresses the variation of the color tone due to the variation of the thicknesses of the antireflection films 120, 130, 220 and 230. The color filter 500 for a liquid crystal display, provided with the black matrix-screen 510 formed on the transparent substrate 110 or 210 further improves the visibility of the liquid crystal display. Thus, the present invention enables fabricating a liquid crystal panel capable of displaying pictures in a high display quality.

What is claimed is:

1. A blank for forming a black matrix-screen, comprising:

a transparent substrate; and a laminated film formed by sequentially forming a first antireflection film, a second antireflection film and a screening film in that order on one major surface of the transparent substrate;

said transparent substrate and the first antireflection film, the second antireflection film and the screening film meeting in the substantially entire visible wavelength range an inequality:

$$n_s < n_1 n_2 < n_3$$

where $n_s$ is the refractive index of the transparent substrate, $n_1$ is the real part of the complex index of refraction of the first antireflection film, no is the real part of the complex index of refraction of the second antireflection film, and $n_3$ is the real part of the complex index of refraction of the screening film.

2. A blank for forming a black matrix-screen, according to claim 1, wherein the transparent substrate, the first antireflection film, the second antireflection film and the screening film meet the inequality:

$$n_s < n_1 < n_2 < n_3$$

at least in the wavelength range of 450 to 650 nm of the visible wavelength range.

3. A blank for forming a black matrix-screen, according to claim 1, wherein the first antireflection film, the second antireflection film and the screening film meet in the substantially entire visible wavelength range an inequality:

$$k_1 < k_2 < k_3$$

where $k_1$ is the imaginary part of the complex index of refraction of the first antireflection film, $k_2$ is the imaginary part of the complex index of refraction of the second antireflection film, and $k_3$ is the imaginary part of the complex index of refraction of the screening film.

4. A blank for forming a black matrix-screen, according to claim 1, wherein each of the first and the second antireflection films is a semitransparent film formed of a chromium compound containing chromium as a principal component, and the screening film is formed of chromium, a chromium compound containing chromium as a principal component.

5. A blank for forming a black matrix-screen, according to claim 4, wherein the first antireflection film contains 30 to 50% at. chromium, and one of oxygen, a combination of oxygen and nitrogen, a combination of oxygen and carbon and a combination of oxygen, nitrogen and carbon, the second antireflection film contains 45 to 65% at. chromium, and one of oxygen, a combination of oxygen and nitrogen, a combination of oxygen and carbon and a combination of oxygen, nitrogen and carbon, and the screening film is formed of chromium.

6. A blank for forming a black matrix-screen, according to claim 4, wherein the first antireflection film contains 30 to 50% at. chromium, and one of oxygen, a combination of oxygen and nitrogen, a combination of oxygen and carbon and a combination of oxygen, nitrogen and carbon, the second antireflection film contains 45 to 65% at. chromium, and one of oxygen, a combination of oxygen and nitrogen, a combination of oxygen and carbon and a combination of oxygen, nitrogen and carbon, and the screening film is formed of 60% at. or above chromium, and one of oxygen, a combination of oxygen and nitrogen, a combination of oxygen and carbon and a combination of oxygen, nitrogen and carbon.

7. A color filter for a liquid crystal display, comprising:

a transparent substrate; and a black matrix-screen formed on the transparent substrate;

said black matrix-screen comprising a first antireflection film, a second antireflection film and a screening film formed sequentially in that order on one major surface of the transparent substrate, and the transparent substrate, the first antireflection film, the second antireflection film and the screening film meet in the substantially entire visible wavelength range an inequality:

$$n_s < n_1 < n_2 < n_3$$

where $n_s$ is the refractive index of the transparent substrate, $n_1$ is the real part of the complex index of refraction of the first antireflection film, $n_2$ is the real part of the complex index of refraction of the second antireflection film, and $n_3$ is the real part of the complex index of refraction of the screening film.

8. A color filter for a liquid crystal display, according to claim 7, wherein the transparent substrate, the first antireflection film, the second antireflection film and the screening film meet the inequality:

$$n_s < n_1 < n_2 < n_3$$

at least in the wavelength range of 450 to 650 nm of the visible wavelength range.

9. A color filter for a liquid crystal display, according to claim 7, wherein the first antireflection film, the second antireflection film and the screening film meet in the substantially entire visible wavelength range an inequality:

$$k_1 < k_2 < k_3$$

where $k_1$ is the imaginary part of the complex index of refraction of the first antireflection film, $k_2$ is the imaginary part of the complex index of refraction of the second antireflection film, and $k_3$ is the imaginary part of the complex index of refraction of the screening film.

10. A color filter for a liquid crystal display, according to claim 7, wherein each of the first and the second antireflection films is a semitransparent film formed of a chromium compound or a chromium mixture, containing chromium as a principal component, and the screening film is formed of chromium, a chromium compound containing chromium as a principal component.

11. A color filter for a liquid crystal display, according to claim 10, wherein the first antireflection film contains 30 to 50% at. chromium, and one of oxygen, a combination of oxygen and nitrogen, a combination of oxygen and carbon and a combination of oxygen, nitrogen and carbon, the second antireflection film contains 45 to 65% at. chromium, and one of oxygen, a combination of oxygen and nitrogen, a combination of oxygen and carbon and a combination of oxygen, nitrogen and carbon, and the screening film is formed of chromium.

12. A color filter for a liquid crystal display, according to claim 10, wherein, the first antireflection film contains 30 to 50% at. chromium, and one of oxygen, a combination of oxygen and nitrogen, a combination of oxygen and carbon and a combination of oxygen, nitrogen and carbon, the second antireflection film contains 45 to 65% at. chromium, and one of oxygen, a combination of oxygen and nitrogen, a combination of oxygen and carbon and a combination of oxygen, nitrogen and carbon, and the screening film is formed of 60% at. or above chromium, and one of oxygen, a combination of oxygen and nitrogen, a combination of oxygen and carbon and a combination of oxygen, nitrogen and carbon.

* * * * *